US006985407B1

(12) United States Patent
Benjamin

(10) Patent No.: US 6,985,407 B1
(45) Date of Patent: Jan. 10, 2006

(54) MULTI-LAYER COMPOSITE TRANSDUCER ARRAY

(75) Inventor: Kim C. Benjamin, Portsmouth, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 171 days.

(21) Appl. No.: 10/769,708

(22) Filed: Feb. 2, 2004

(51) Int. Cl.
*H04R 17/00* (2006.01)
*H01L 41/08* (2006.01)
*H01L 41/047* (2006.01)

(52) U.S. Cl. ...................... 367/153; 367/155; 310/334; 310/358

(58) Field of Classification Search ................ 367/153, 367/155; 310/334, 800, 357, 358, 359
See application file for complete search history.

(56) References Cited

U.S. PATENT DOCUMENTS 3,590,287 A * 6/1971 Berlincourt et al. ........ 310/359
4,683,396 A * 7/1987 Takeuchi et al. ............ 310/358
4,805,157 A * 2/1989 Ricketts ....................... 367/155
5,329,496 A * 7/1994 Smith .......................... 367/155
5,530,683 A * 6/1996 Lindberg ..................... 367/153
5,625,149 A * 4/1997 Gururaja et al. ............ 310/358

* cited by examiner

*Primary Examiner*—Ian J. Lobo
(74) *Attorney, Agent, or Firm*—James M. Kasischke; Michael P. Stanley; Jean Paul A. Nasser

(57) ABSTRACT

A multi-layer composite transducer array includes at least one pair of composite transducers with an electrical and mechanical isolation layer disposed therebetween. Each composite transducer is defined by a composite panel having a common electrode coupled to a first surface and electrode segments electrically isolated from one another and coupled to a second surface. Each pair of composite transducers is configured such that the electrode segments associated with the pair's composite transducers oppose and are aligned with one another. The isolation layer has dielectric material segments that are sized, shaped and aligned in correspondence with opposing and aligned ones of the electrode segments associated with the pair's transducers. Spaces formed in the isolation layer between the dielectric material segments are filled with a viscoelastic material.

17 Claims, 3 Drawing Sheets

MULTI-LAYER COMPOSITE TRANSDUCER ARRAY

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION (1) Field of the Invention

The present invention relates generally to transducer arrays, and more particularly to a multi-layer composite transducer array that provides a broadband frequency response.

(2) Description of the Prior Art

A variety of sonar applications such as vehicle homing require the steering of acoustic beams. Existing homing array technology uses numerous narrowband and high-power longitutdinal tonpilz resonators to form the aperture of an active transducer. Each tonpilz resonator consists of several active and inactive mechanical components that work together as a spring-mass, single degree-of-freedom system. Unfortunately, tonpilz resonators are expensive to fabricate and offer only a limited operational bandwidth above their first length mode resonance.

To address operational bandwidth limitations of tonpilz resonators, recent work has focused on constructing multi-resonance tonpilz elements using 1–3 piezocomposites as the active component. While this approach provides improved bandwidth when compared to that of the original single-mode tonpilz resonators, these devices are still limited to first order resonance. Furthermore, the fixed-size radiation head masses inherent to tonpilz resonators prevent them from being used to realize resonators that are "frequency agile".

SUMMARY OF THE INVENTION

Accordingly, it is an object of the present invention to provide a transducer array that can operate in a broadband frequency range.

Another object of the present invention is to provide a broadband transducer array that is inexpensive to fabricate.

Other objects and advantages of the present invention will become more obvious hereinafter in the specification and drawings.

In accordance with the present invention, a multi-layer composite transducer array includes at least one pair of composite transducers with a layer of dielectric material segments interposed therebetween. Each composite transducer is defined by a piezoelectric polymer composite panel having opposing first and second surfaces with at least one common electrode coupled to the first surface and a plurality of electrode segments electrically isolated from one another and coupled to the second surface. Each pair of composite transducers is configured such that the electrode segments associated with a first composite transducer oppose and are aligned with the electrode segments associated with a second composite transducer. Each dielectric material segment in the layer thereof is sized, shaped and aligned in correspondence with opposing and aligned ones of the electrode segments associated with the first and second composite transducers. Spaces formed in the layer between the dielectric material segments are filled with a viscoelastic material.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED EMBODIMENT(S)

Figure 1:
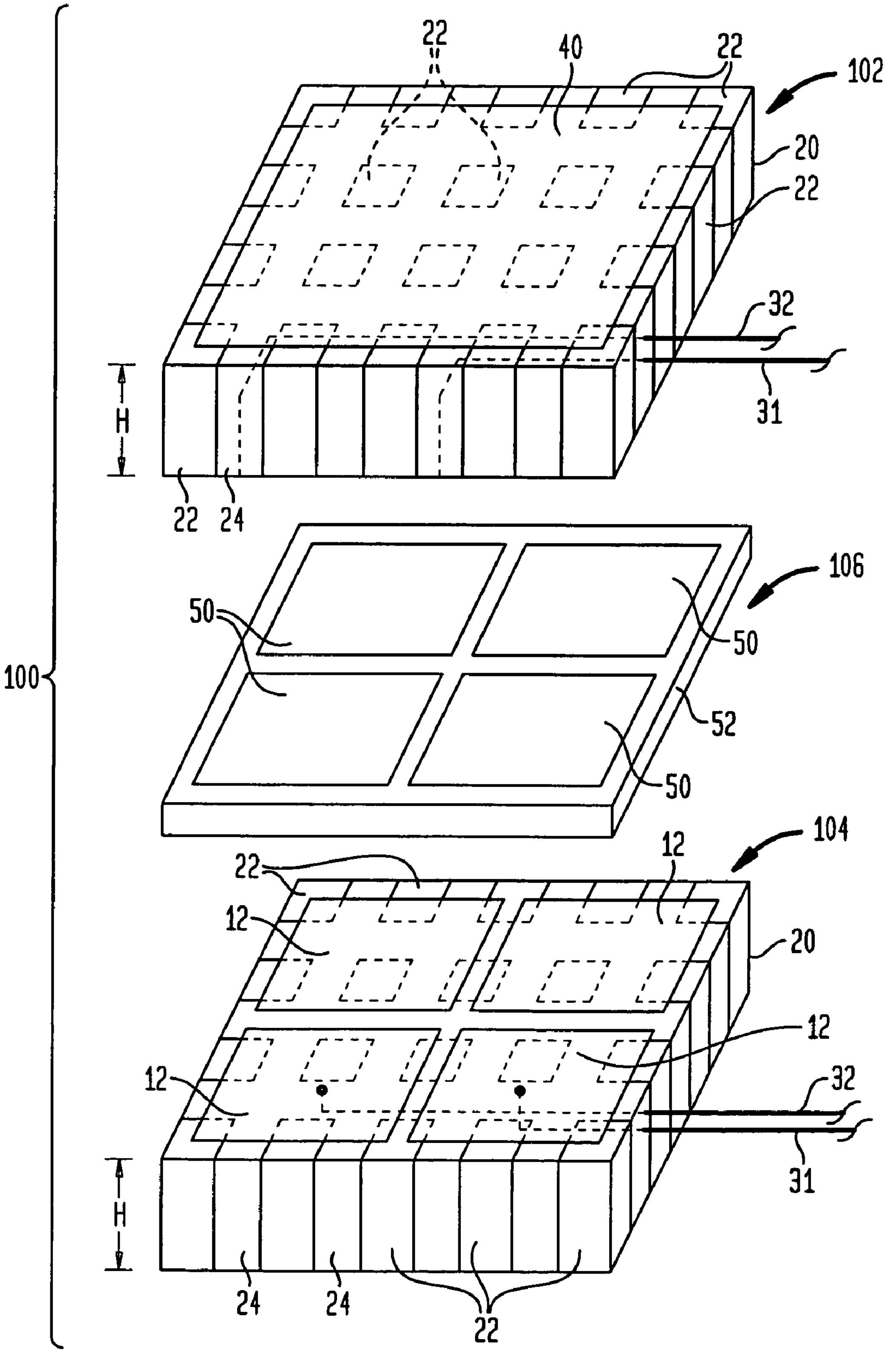
FIG. 1 is an exploded perspective view of a pair of composite transducers and an isolation layer that forms a multi-layer composite transducer array in accordance with the present invention.
Figure 2:
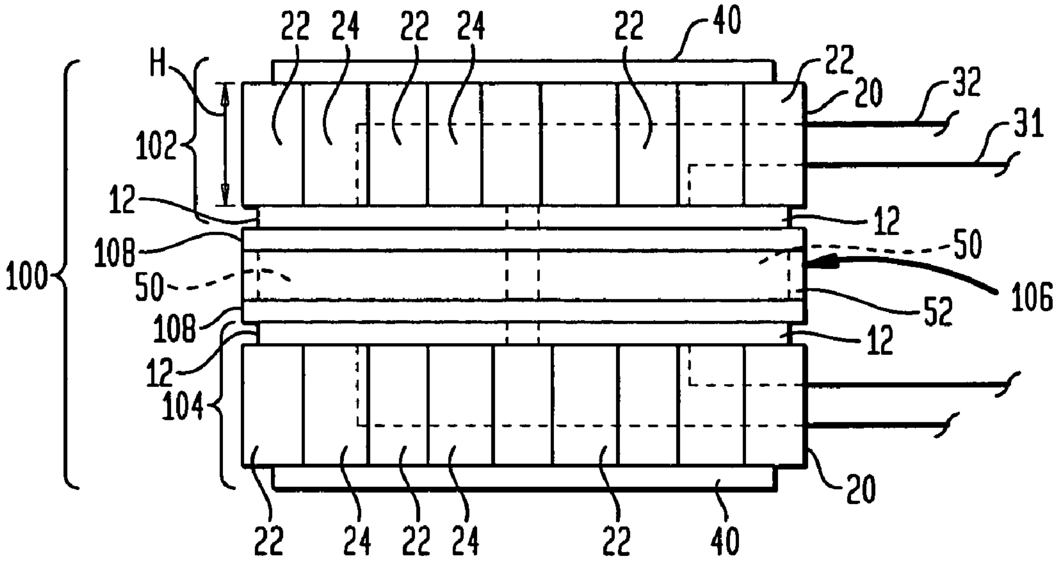
FIG. 2 is a side view of an assembled embodiment of the multi-layer composite transducer array.

Referring now to the drawings, simultaneous reference will be made to FIGS. 1 and 2 where a multi-layer composite transducer array is shown and referenced generally by numeral 100. More specifically, FIG. 1 is an exploded perspective view depicting a pair of composite transducers having a segmented electrode surface and isolation layer disposed between the composite transducers, and FIG. 2 is a side view of an assembled embodiment of the multi-layer array.

Array 100 has a pair of composite transducers 102 and 104 with an electrical and mechanical isolation layer 106 disposed therebetween. Each of composite transducers 102 and 104 is identically constructed so that the following description of composite transducer 102 applies to composite transducer 104. A plurality of electrode segments 12 are supported on a first major surface of a piezoelectric polymer composite panel 20. The number, size and shape of electrode segments is not a limitation of the present invention. Details of a suitable composite panel are described in U.S. Pat. No. 6,255,761, the contents of which are hereby incorporated by reference. Briefly, composite panel 20 is constructed using spaced-apart piezoelectric (e.g., a ferroelectric material such as piezoceramic materials lead zirconate titanate or lead titanate) columns or rods 22 that span the thickness or height H of composite panel 20. Filling the spaces between rods 22 for the full height thereof is a viscoelastic material 24 such as a thermoplastic epoxy.

Each of electrode segments 12 can have a dedicated electrical lead coupled thereto. This can be accomplished by passing conductors (e.g., conductors 31 and 32 are illustrated in FIG. 2) through a side of composite panel 20. More specifically, each of conductors 31 and 32 is routed through viscoelastic material 24 and electrically coupled to one of electrode segments 12. The second major surface of composite panel 20 has a single common electrode 40 that substantially spans and is coupled to composite panel 20. Note, however, that the single common electrode 40 could be replaced with a plurality of common electrodes (i.e., at the same potential) without departing form the scope of the present invention. Typically, the height H of composite panel 20 is the same throughout so that planes defined by electrode segments 12 and common electrode 40 are parallel to one another.

Figure 3:
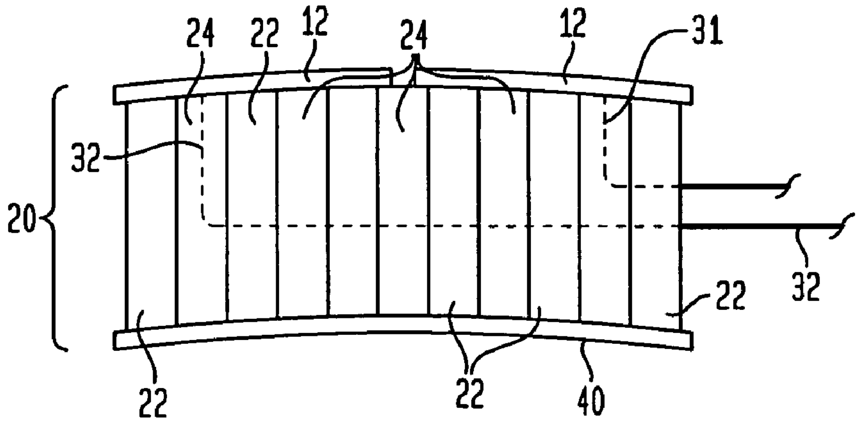
FIG. 3 is a side view of one of the layers of the transducer array in which the piezoelectric polymer composite panel and the electrodes coupled thereto are shaped or curved.

Each layer of the multi-layer array can also be shaped to conform to simple or complex contours if viscoelastic material 24 comprises a thermoplastic material such as thermoplastic epoxy. For example, as illustrated in FIG. 3, composite panel 20 has been shaped (e.g., by heating) such that the planes defined by, electrode segments 12 and common electrode 40 are curved in correspondence with one another and composite panel 20.

Composite transducers 102 and 104 are configured and positioned in array 100 such that electrode segments 12 on composite transducer 102 oppose and are aligned with electrode segments on composite transducer 104. Separating composite transducers 102 and 104 is isolation layer 106 that consists of dielectric material segments 50 extending through layer 106 and a viscoelastic material 52 that can be the same material as that used for viscoelastic material 24. Each of dielectric material segments 50 is sized, shaped and aligned with opposing and aligned ones of electrode segments 12 from composite transducers 102 and 104. Since electrode segments 12 are electrically isolated from one another by spaces therebetween, similar spaces are formed between dielectric material segments 50. The spaces between segments 50 (and regions surrounding segments 50 up to the edges of array 100) are filled with viscoelastic material 52. In this way, dielectric material segments 50 provide the needed electrical isolation between opposing electrodes 12 on composite transducers 102 and 104, while viscoelastic material 52 provides mechanical damping and isolation between composite transducers 102 and 104.

Composite transducers 102 and 104 are typically bonded to isolation layer 106 by an adhesive 108 so that no external type of clamping is required to hold array 100 together. Any commercially-available structural adhesive can be used provided it is acoustically transparent and can withstand the rigors of the environment in which array 100 is to be deployed.

Figure 4:
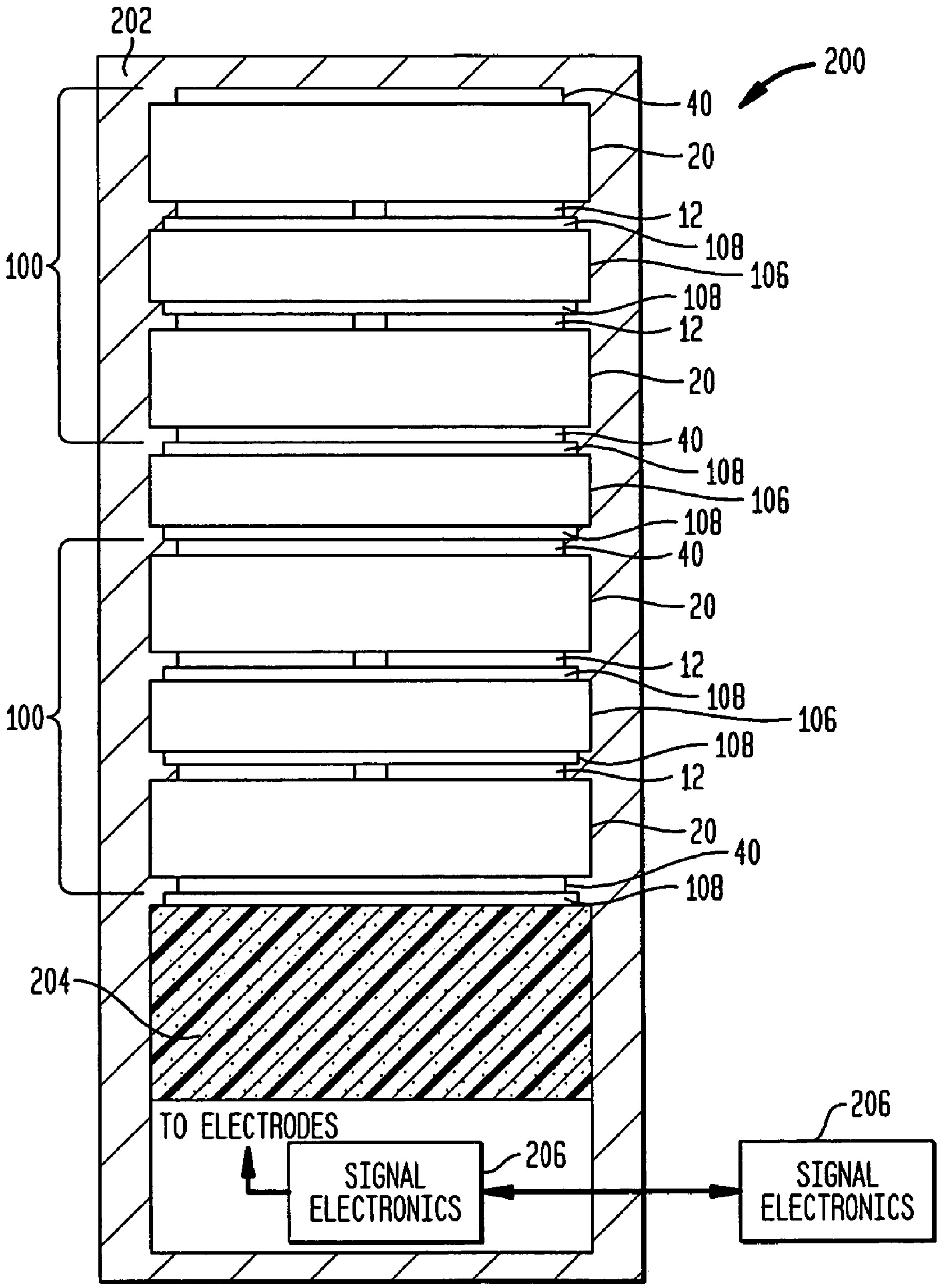
FIG. 4 is a cross-sectional view of a multi-layer composite transducer array assembly for use in an underwater environment in accordance with the present invention.

The multi-layer composite transducer array described herein can be used as part of an underwater array assembly such as assembly 200 illustrated in FIG. 4 where like reference numerals are used to describe the elements incorporated into assembly 200. A waterproof housing (e.g., a waterproof encapsulant) 202 has one or more arrays 100 (e.g., two are shown) fitted and sealed therein. An acoustic absorbing material 204 (e.g., a particle-filled epoxy) partially fills waterproof housing 202. The lowermost composite transducer in the stack of multi-layer arrays 100 is coupled to acoustic absorbing material 204 by means of adhesive 108. More specifically, common electrode 40 of the lowermost composite transducer is adhered to acoustic absorbing material 204. At the other end of the stack of multi-layer arrays 100, common electrode 40 of the uppermost composite transducer abuts waterproof housing 202. Note that this portion of waterproof housing 202 must be acoustically transparent to facilitate the transmission of sound waves. Another isolation layer 106 is disposed between arrays 100 and is coupled to each of arrays 100 by adhesive 108.

Signal electronics 206 can be located within and/or outside of housing 202 as illustrated. Conductors (not shown for clarity of illustration) coupling signal electronics 206 to the electrodes (i.e., electrode segments 12 and common electrodes 40) in multi-layer arrays 100 are passed through acoustic absorbing material 204 and through each composite transducer's composite panel as described above.

The advantages of the present invention are numerous. Broadband operation is achieved owing to the combination of: (i) the inherent broadband resonance of each composite transducer's piezoelectric polymer composite panel 20, and (ii) the fact that the array's individual layers can be separately addressed/tuned to a different frequency range. The present invention also provides an improved spatial field-of-view since numerous elements may be formed by selectively applying electrodes over the array aperture to form elements having different (non-uniform) apertures. The invention teaches element apertures that can be varied in size by simply addressing electrode segments separately. High frequency responses are achieved using small sized electrode segments. The electrode segments can be combined for low frequency responses, or larger sized electrode segments could be used.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A multi-layer composite transducer array, comprising:

at least one pair of composite transducers, each of said composite transducers defined by a piezoelectric polymer composite panel having opposing first and second surfaces with at least one common electrode coupled to said first surface and a plurality of electrode segments electrically isolated from one another and coupled to said second surface;

each said pair of composite transducers configured such that said plurality of electrode segments associated with a first composite transducer of said pair of composite transducers oppose and are aligned with said plurality of electrode segments associated with a second composite transducer of said pair of composite transducers;

a layer of dielectric material segments interposed between said first composite transducer and said second composite transducer, said dielectric material segments in said layer being sized, shaped and aligned in correspondence with opposing and aligned ones of said plurality of electrode segments associated with said first composite transducer and said second composite transducer, wherein spaces are formed in said layer between said dielectric material segments; and a viscoelastic material filling said spaces formed in said layer, wherein said layer of dielectric material segments in combination with said viscoelastic material defines an isolation layer.

2. A multi-layer composite transducer array as in claim 1 wherein each said piezoelectric polymer composite panel comprises:

a plurality of piezoelectric rods spaced apart from one another and spanning between said first and second surfaces; and a second viscoelastic material filling spaces between said plurality of piezoelectric rods between said first and second surfaces.

3. A multi-layer composite transducer array as in claim 2 wherein said second viscoelastic material comprises a thermoplastic epoxy.

4. A multi-layer composite transducer array as in claim 1 wherein, for each of said composite transducers, said at least one common electrode defines a first transducer plane and said plurality of electrode segments define a second transducer plane, and wherein said first transducer plane and said second transducer plane are parallel to one another.

5. A multi-layer composite transducer array as in claim 1 wherein, for each of said composite transducers, said at least one common electrode defines a first transducer plane and said plurality of electrode segments define a second transducer plane, and wherein said first transducer plane, said second transducer plane, and said piezoelectric polymer composite panel interposed therebetween are shaped in correspondence with one another.

6. A multi-layer composite transducer array as in claim 1 wherein, when at least two pairs of said composite transducers are used, said multi-layer composite transducer array further comprises:

another layer of dielectric material segments interposed between two pairs of said composite transducers said dielectric material segments in said another layer being sized, shaped and aligned in correspondence with opposing and aligned ones of said plurality of electrode segments associated with said two pairs, wherein spaces are formed in said another layer between said dielectric material segments associated therewith; and a second viscoelastic material filling said spaces formed in said another layer of said dielectric material segments, wherein said another layer of dielectric material segments with said second viscoelastic material defines another isolation layer.

7. A multi-layer composite transducer array as in claim 1 further comprising an adhesive for bonding said isolation layer to each of said first composite transducer and said second composite transducer.

8. A multi-layer composite transducer array as in claim 6 further comprising an adhesive for bonding said isolation layer to each of said first composite transducer and said second composite transducer, and for bonding said another isolation layer to each of said two pairs.

9. A multi-layer composite transducer array as in claim 1 wherein, for each of said composite transducers, said at least one common electrode comprises a single common electrode spanning substantially all of said first surface.

10. A multi-layer composite transducer array assembly, comprising:

a waterproof housing;

an acoustic absorbing material partially filing said waterproof housing;

at least one pair of composite transducers fitted in said waterproof housing, each of said composite transducers defined by a piezoelectric polymer composite panel having opposing first and second surfaces with at least one common electrode coupled to said first surface and a plurality of electrode segments electrically isolated from one another and coupled to said second surface;

each said pair of composite transducers configured such that said plurality of electrode segments associated with a first composite transducer of said pair of composite transducers oppose and are aligned with said plurality of electrode segments associated with a second composite transducer of said pair of composite transducers;

a layer of dielectric material segments interposed between said first composite transducer and said second composite transducer, said dielectric material segments in said layer being sized, shaped and aligned in correspondence with opposing and aligned ones of said plurality of electrode segments associated with said first composite transducer and said second composite transducer, wherein spaces are formed in said layer between said dielectric material segments;

a viscoelastic material filling said spaces formed in said layer, wherein said layer of dielectric material segments in combination with said viscoelastic material defines an isolation layer; and an adhesive for bonding said isolation layer to each of said first composite transducer and said second composite transducer, and for bonding said at least one common electrode of said second composite transducer to said acoustic absorbing material.

11. A multi-layer composite transducer array assembly as in claim 10 wherein each said piezoelectric polymer composite panel comprises:

a plurality of piezoelectric rods spaced apart from one another and spanning between said first and second surfaces; and a second viscoelastic material filling spaces between said plurality of piezoelectric rods between said first and second surfaces.

12. A multi-layer composite transducer array assembly as in claim 11 wherein said viscoelastic material and said second viscoelastic material comprise a thermoplastic epoxy.

13. A multi-layer composite transducer array assembly as in claim 10 wherein, for each of said composite transducers, said at least one common electrode defines a first transducer plane and said plurality of electrode segments define a second transducer plane, and wherein said first transducer plane and said second transducer plane are parallel to one another.

14. A multi-layer composite transducer array assembly as in claim 10 wherein, for each of said composite transducers, said at least one common electrode defines a first transducer plane and said plurality of electrode segments define a second transducer plane, and wherein said first transducer plane, said second transducer plane, and said piezoelectric polymer composite panel interposed therebetween are shaped in correspondence with one another.

15. A multi-layer composite transducer array assembly as in claim 10 wherein, when at least two pairs of said composite transducers are used, said multi-layer composite transducer array further comprises:

another layer of dielectric material segments interposed between two pairs of said composite transducers, said dielectric material segments in said another layer being sized, shaped and aligned in correspondence with opposing and aligned ones of said plurality of electrode segments associated with said two pairs, wherein spaces are formed in said another layer between said dielectric material segments associated therewith; and a second viscoelastic material filling said spaces formed in said another layer of said dielectric material segments, wherein said another layer of dielectric material segments with said second viscoelastic material defines another isolation layer.

16. A multi-layer composite transducer array assembly as in claim 15 wherein said adhesive is further used to bond said another isolation layer to each of said two pairs.

17. A multi-layer composite transducer array assembly as in claim 10 wherein, for each of said composite transducers, said at least one common electrode comprises a single common electrode spanning substantially all of said first surface.

* * * * *